US009612498B2

(12) United States Patent
Hara et al.

(10) Patent No.: US 9,612,498 B2
(45) Date of Patent: Apr. 4, 2017

(54) SEMICONDUCTOR DEVICE AND DISPLAY DEVICE

(71) Applicant: Sharp Kabushiki Kaisha, Osaka-shi, Osaka (JP)

(72) Inventors: Yoshihito Hara, Osaka-shi (JP); Yukinobu Nakata, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/436,131

(22) PCT Filed: Nov. 14, 2013

(86) PCT No.: PCT/JP2013/080750
§ 371 (c)(1),
(2) Date: Apr. 16, 2015

(87) PCT Pub. No.: WO2014/080825
PCT Pub. Date: May 30, 2014

(65) Prior Publication Data
US 2015/0268498 A1 Sep. 24, 2015

(30) Foreign Application Priority Data

Nov. 21, 2012 (JP) .................................. 2012-254916

(51) Int. Cl.
*G02F 1/136* (2006.01)
*G02F 1/1368* (2006.01)
(Continued)

(52) U.S. Cl.
CPC .......... *G02F 1/1368* (2013.01); *G02F 1/1336* (2013.01); *G02F 1/134309* (2013.01);
(Continued)

(58) Field of Classification Search
CPC ............. G02F 1/1362; G02F 1/134309; G02F 1/1336; G02F 1/1368; H01L 27/124;
(Continued)

(56) References Cited

U.S. PATENT DOCUMENTS

2006/0046335 A1  3/2006  Sarma et al.
2010/0176388 A1  7/2010  Ha et al.
(Continued)

FOREIGN PATENT DOCUMENTS

JP       06-177387 A    6/1994
JP    2001-313398 A    11/2001
(Continued)

OTHER PUBLICATIONS

Official Communication issued in International Patent Application No. PCT/JP2013/080750, mailed on Feb. 18, 2014.

*Primary Examiner* — James Dudek
(74) *Attorney, Agent, or Firm* — Keating & Bennett, LLP

(57) ABSTRACT

A semiconductor device 1 according to the present invention includes a first electrode G (g1) formed on a substrate B, a first insulation film GI to cover the first electrode g1, a semiconductor film SF including a channel CH, an etching stopper film ES, and a second electrode S (s3). The semiconductor film SF is formed on the first insulation film GI with overlapping the first electrode g1 so that an edge portion SF1 thereof projects outwardly from the first electrode g1 in a plan view. The etching stopper film ES is formed of an insulation film and formed on the semiconductor film SF and the first insulation film GI to cover the channel CH. The etching stopper film ES includes a hole H (hd) in which the edge portion SF1 of the semiconductor film SF is and through which a surface of a portion of the semiconductor film SF near the channel CH is exposed in a plan view. The second electrode S (s3) is disposed on the
(Continued)

semiconductor film SF to cover the surface of the portion of the semiconductor film SF exposed through the hole H (hd).

14 Claims, 12 Drawing Sheets

(51) Int. Cl.
    *H01L 29/786* (2006.01)
    *H01L 27/12* (2006.01)
    *G02F 1/1335* (2006.01)
    *G02F 1/1343* (2006.01)
    *H01L 29/24* (2006.01)
    *H01L 29/417* (2006.01)
    *H01L 29/423* (2006.01)

(52) U.S. Cl.
    CPC ........ *H01L 27/124* (2013.01); *H01L 27/1225* (2013.01); *H01L 29/24* (2013.01); *H01L 29/41733* (2013.01); *H01L 29/42384* (2013.01); *H01L 29/7869* (2013.01); *H01L 29/78696* (2013.01); *G02F 2001/13606* (2013.01); *G02F 2001/134372* (2013.01)

(58) Field of Classification Search
    CPC ................ H01L 27/1225; H91L 29/24; H91L 29/41733; H91L 29/42384; H91L 29/7869; H91L 29/78696
    See application file for complete search history.

(56) References Cited

U.S. PATENT DOCUMENTS

| | | | |
|---|---|---|---|
| 2010/0200851 A1* | 8/2010 | Oikawa | H01L 27/1214 257/43 |
| 2012/0214276 A1 | 8/2012 | Oikawa et al. | |
| 2012/0249915 A1* | 10/2012 | Morosawa | H01L 27/1225 349/43 |
| 2013/0161604 A1* | 6/2013 | Huang | G02F 1/13458 257/43 |
| 2013/0181217 A1 | 7/2013 | Hara et al. | |
| 2015/0049277 A1 | 2/2015 | Oikawa et al. | |

FOREIGN PATENT DOCUMENTS

| | | |
|---|---|---|
| JP | 2008-511999 A | 4/2008 |
| JP | 2010-161373 A | 7/2010 |
| JP | 2010-206187 A | 9/2010 |
| WO | 2012/046658 A1 | 4/2012 |

\* cited by examiner

SEMICONDUCTOR DEVICE AND DISPLAY DEVICE

TECHNICAL FIELD

The present invention relates to a semiconductor device and a display device.

BACKGROUND ART

A semiconductor device such as a circuit board including semiconductor components such as thin film transistors (TFTs) has been widely used as a component of an electronic device such as a liquid crystal display device, an electroluminescent display device, and an electrophoretic display device.

Hereinafter, a circuit configuration of a TFT array board included in a liquid crystal panel that is driven with the TFTs will be described. Generally, the TFT array board includes a pixel circuit including m-lines of scanning lines and n-columns of signal lines and the TFTs that are switching components. The scanning lines and the signal lines are arranged in a matrix of m×n and the TFTs are arranged on intersections of the scanning lines and the signal lines, respectively. Drain electrodes of the TFTs are electrically connected to pixel electrodes. Peripheral circuits such as a scanning driver integrated circuit (IC) and a data driver IC are electrically connected to gate lines and source lines extending from the respective TFTs.

Operations of the circuits are generally influenced by performances of the TFTs that are disposed on the TFT array board. The performances of the TFTs disposed on the TFT array board vary according to materials thereof. Therefore, the TFTs disposed on the circuit influence whether the circuit can operates, whether a size of the circuit is increased, or whether a yield rate is decreased, and operations of the circuit disposed on the TFT array board are influenced thereby. Amorphous silicon (a-Si) has been widely used in the semiconductor devices (the circuit boards) because the TFTs are formed easily with a low cost.

A method of manufacturing a semiconductor device including oxide semiconductor films instead of including the amorphous silicon semiconductor films has been disclosed (for example, Patent Document 1).

RELATED ART DOCUMENT

Patent Document

Patent Document 1: International Patent Application Publication No. 2012-046658

Problem to be Solved by the Invention

In recent years, use of oxide semiconductors (for example, indium gallium zinc oxide) having higher electron mobility in the semiconductor device has been proposed instead of use of amorphous silicon (a-Si). The present inventors propose to provide an etching stopper process (hereinafter, that may be referred to as an ES process) of forming an etching stopper layer (film) on at least a middle portion (a channel area) of the oxide semiconductor from a view point of reliability.

There have been demands for achieving higher resolution (for example, 300 dots per inch (dpi) or higher) in a small-sized liquid crystal panel. The liquid crystal panel having higher resolution and smaller-sized pixel electrodes decreases the entire capacitance of the liquid crystal panel as a whole. Accordingly, a rate of the Cgd capacitance in the entire capacitance is increased because the capacitance between a gate electrode and a drain electrode (the Cgd capacitance) is substantially constant. The Cgd capacitance is generated between a gate metal, and a semiconductor layer (film) and a source metal. The gate metal is opposite the semiconductor layer and the source metal via an insulation layer.

The liquid crystal panel with the ES process tends to have a Cgd capacitance greater than that of the liquid crystal panel of a back-channel etching type (a liquid crystal panel having a CE structure). It is desired in a small-sized liquid crystal panel with the ES process to reduce the Cgd capacitance properly, cause less influence by the Cgd capacitance on applied voltage and achieve appropriate application of voltage that is to be supposed, and eventually improve display performances of a display device including a semiconductor device (a circuit board).

As a method of reducing the Cgd capacitance, for example, it is proposed to decrease a size of the gate metal to decrease an area of the gate metal overlapping the semiconductor layer and the source metal in a plan view of the board. With such a method, a part of the semiconductor layer protrudes outwardly from the gate metal in a plan view of the board.

The gate metal causes the Cgd capacitance to be generated and also prevents (blocks) light exiting from a backlight device toward the liquid crystal panel (the TFT array board) from reaching the semiconductor layer. Therefore, if the size of the gate metal becomes small, the light from the backlight device reaches the part of the semiconductor layer projecting outwardly from the gate metal in a plan view of the board. If the light reaches the semiconductor layer and the semiconductor layer is exposed to the light, performances of the semiconductor layer is deteriorated. Especially, the semiconductor layer that is formed of oxide semiconductors receives serious damages and the performances thereof are deteriorated by the light.

On the TFT array board, the semiconductor layer (the semiconductor film) is between a gate insulation layer covering the gate metal and the etching stopper layer (film) that is an insulation layer. If the light from the backlight device reaches such a semiconductor layer, chemical reaction is caused in the semiconductor layer and charge storage occurs in the semiconductor layer. This may deteriorate performances of the semiconductor layer.

DISCLOSURE OF THE PRESENT INVENTION

The present invention was made in view of the above circumstances. An object of the present invention is to provide a semiconductor device that reduces Cgd capacitance and is less likely to deteriorate performances of oxide semiconductor films and to provide a display device including the semiconductor device.

Means for Solving the Problem

A semiconductor device according to the present invention includes a substrate, a first electrode formed on the substrate, a first insulation film formed on the first electrode and the substrate so as to cover the first electrode, a semiconductor film formed of a oxide semiconductor film and including a channel and an edge portion, the semiconductor film being formed on the first insulation film with overlapping the first electrode so that the edge portion projects outwardly from the first electrode, an etching stopper film formed of an insulation film and formed on the semiconductor film and the first insulation film to cover the channel, the etching stopper film including a hole in which the edge portion is and through which a surface of a portion of the semiconductor film near the channel is exposed in a plan view thereof, and a second electrode disposed on the semiconductor film to cover the surface of the portion of the semiconductor film exposed through the hole.

In the above semiconductor device, the first electrode is formed on the substrate, and the first insulation film is formed on the first electrode and the substrate so as to cover the first electrode. The semiconductor film formed of an oxide semiconductor film is formed on the first insulation film with overlapping the first electrode so that the edge portion projects outwardly from the first electrode. The semiconductor film includes the channel and the etching stopper film formed of an insulation film is formed on the semiconductor film and the first insulation film to cover the channel. The etching stopper film includes a hole in which the edge portion is and through which a surface of a portion of the semiconductor film near the channel is exposed in a plan view thereof. The second electrode is disposed on the semiconductor film to cover the surface of the portion of the semiconductor film exposed through the hole. When light enters the semiconductor device having the above configuration from the substrate side, apart of rays of the light passes through the first insulation film and is directed toward the edge portion of the semiconductor film projecting outwardly from the first electrode. The edge portion of the semiconductor film does not overlap the first electrode and directly receives light. In the semiconductor device, the second electrode is deposited on the semiconductor film to cover the surface of a portion of the semiconductor film exposed through the hole and therefore, the edge portion of the semiconductor film and the second electrode are in contact with each other to be electrically connected to each other. Accordingly, if the edge portion of the semiconductor film receives light and a reaction is caused by the light, generated charges move from the edge portion of the semiconductor film to the second electrode that is in contact with the edge portion of the semiconductor film. As a result, even if the edge portion of the semiconductor film that is not covered with the first electrode in a plan view receives light, the charges are less likely to be stored in the semiconductor film and eventually, the performances of the semiconductor film are less likely to be deteriorated.

In the above semiconductor device, the semiconductor film may have a shape so that a portion thereof other than the edge portion is within an area of the first electrode in a plan view thereof. If light directed toward the semiconductor device from the substrate side is directed toward the portion of the semiconductor film other than the edge portion, the light is blocked by the first electrode that overlaps the portion of the semiconductor film. Because the semiconductor film is arranged so that the portion thereof other than the edge portion is within an area of the first electrode in a plan view, light is less likely to reach the portion and performances of the semiconductor film are less likely to be deteriorated.

In the above semiconductor device, the semiconductor film may have an elongated shape, in a plan view thereof, extending in a direction in which the edge portion projects, and the portion of the semiconductor film on which the second electrode is disposed may be within an area of the second electrode.

In the above semiconductor device, the first electrode may be a gate electrode, and the second electrode may be a drain electrode.

In the above semiconductor device, the first electrode may be branched from a gate line.

The above semiconductor device may further include a source electrode that is disposed on the semiconductor film so as to be opposite the second electrode with the channel being located therebetween.

In the above semiconductor device, the second electrode may be made of same conductive material as the source electrode is.

In the above semiconductor device, the semiconductor film may contain indium gallium zinc oxide.

A display device according to the present invention includes the semiconductor device, a counter substrate arranged opposite the semiconductor device, and a liquid crystal layer arranged between the semiconductor device and the counter substrate.

The above display device may further include a backlight device exiting light toward the semiconductor device.

Advantageous Effect of the Invention

According to the present invention, a semiconductor device that reduces Cgd capacitance and is less likely to deteriorate performances of oxide semiconductor films and a display device including the semiconductor device are provided.

MODE FOR CARRYING OUT THE INVENTION

<First Embodiment>
(TFT Array Board)

Figure 1:
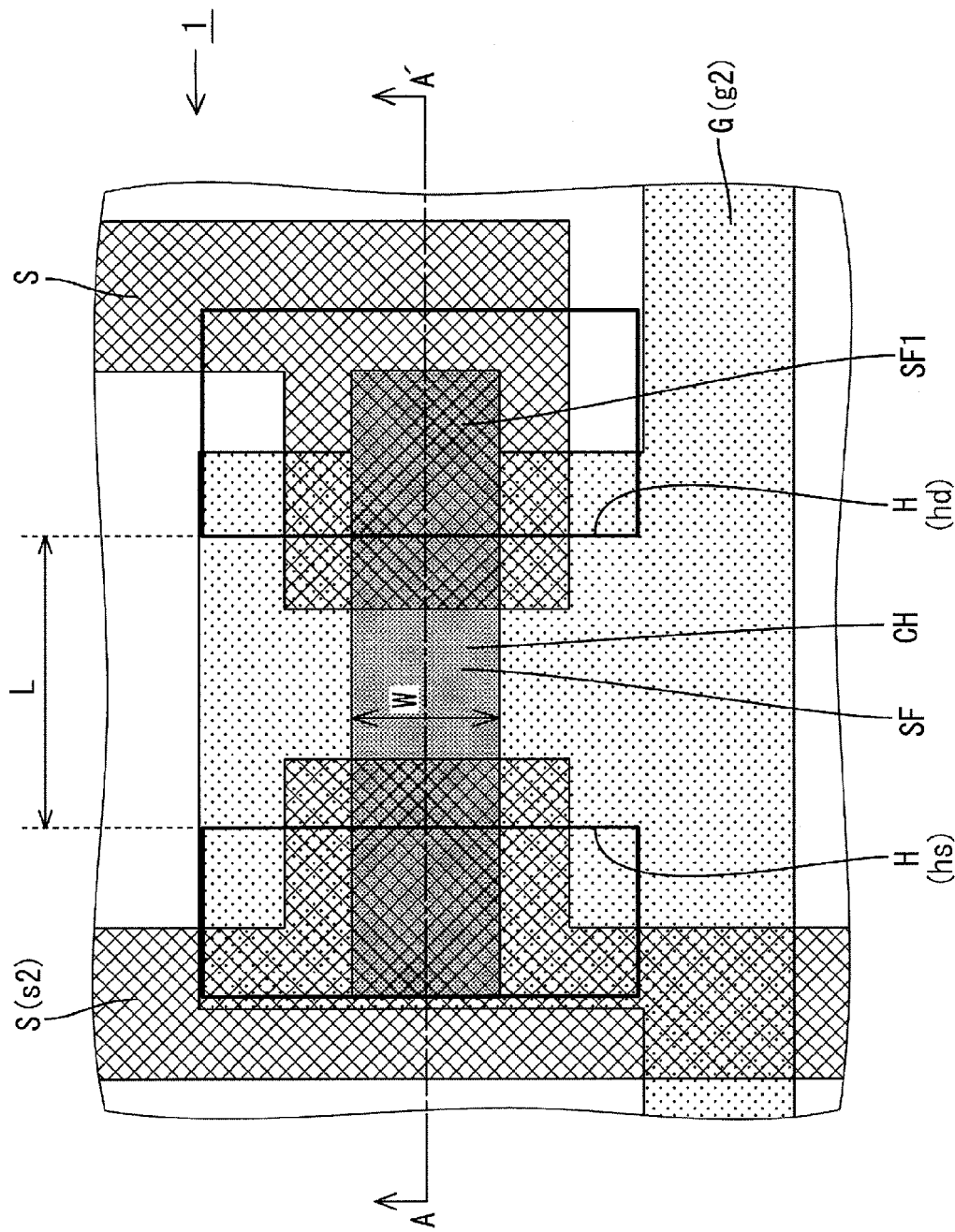
FIG. 1 is a schematic plan view of a TFT portion of a TFT array board according to a first embodiment.

A first embodiment of the present invention will be described with reference to FIGS. 1 to 10. According to this embodiment, a TFT array board (an example of a semiconductor device) used in a liquid crystal display device (an example of a display device) including a backlight device will be described. FIG. 1 illustrates a schematic plan view illustrating a configuration of a TFT portion of a TFT array board 1 according to the first embodiment. The TFT array board 1 of the first embodiment is a circuit board including a transparent substrate B and semiconductor components disposed thereon. The semiconductor components include a semiconductor film SF formed of an oxide semiconductor film containing indium gallium zinc oxide, for example.

The TFT array board 1 includes an etching stopper film ES formed of an insulating material so as to cover at least a middle portion (a channel CH) of the semiconductor film SF. The TFT array board 1 further includes a conductive film (a source metal) S at least a part of which is disposed on the etching stopper film ES. The conductive film S includes a source electrode s1, a source line s2, and a drain electrode s3 (an example of a second electrode). The etching stopper film ES has holes H and components below the holes H are uncovered. In this embodiment, each of the holes H has a rectangular shape in a plan view of the board. In FIG. 1, the etching stopper film ES is provided on portions except for the rectangular portions within the holes H. In a plan view of the board, a part of the source electrode s1 corresponds to or is within a left one (hs) of the two holes H illustrated in FIG. 1, and a part of the drain electrode s3 corresponds to or is within a right one (hd) of the two holes H.

Figure 2:
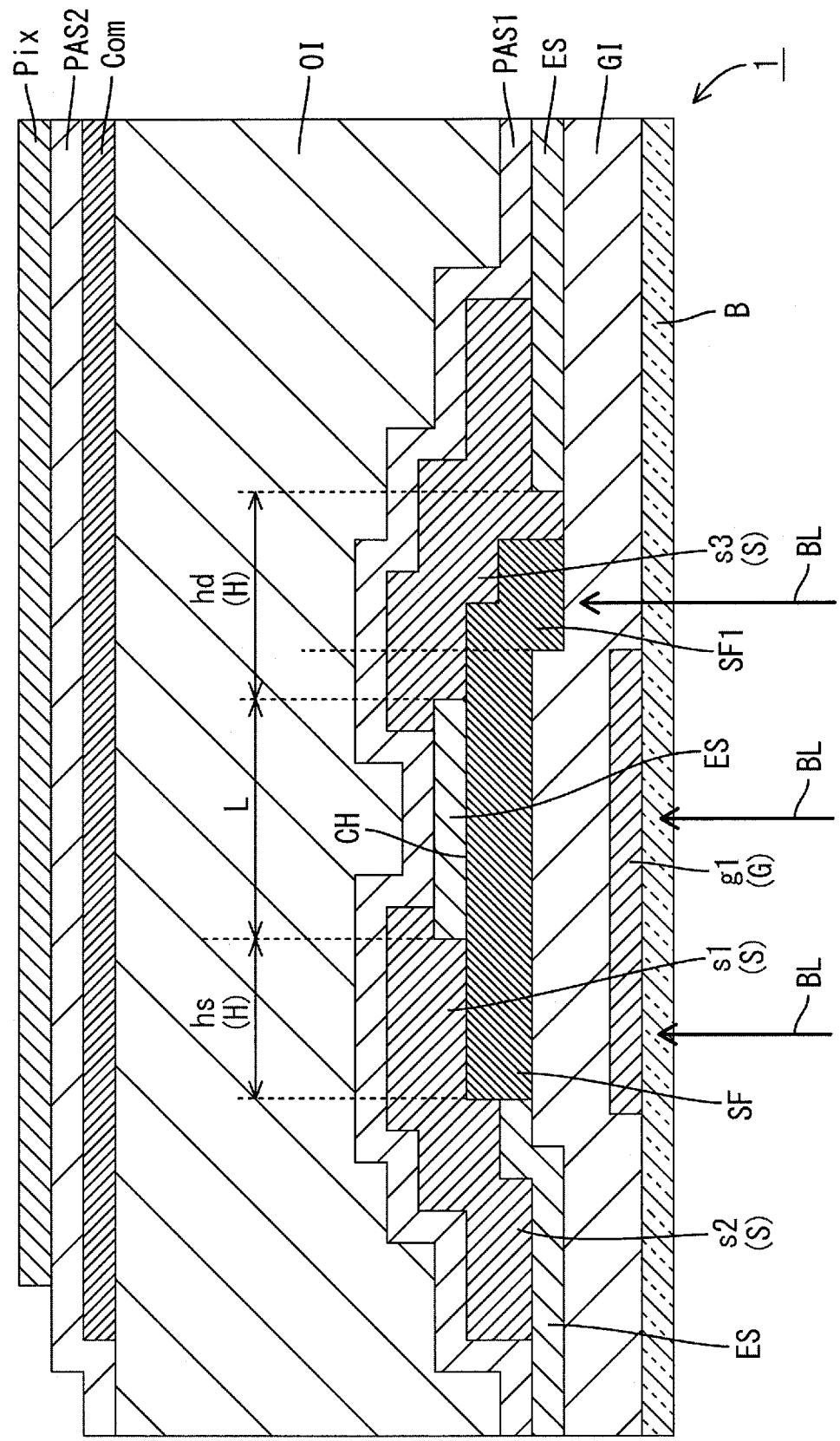
FIG. 2 is a cross-sectional view of FIG. 1 taken along line A-A'.

The TFT array board 1 according to this embodiment is used for a liquid crystal panel that is operated in a fringe field switching (FFS) mode and the TFT array board 1 includes a pair of electrodes (a common electrode and a pixel electrode that will be described later). The pair of electrodes is not illustrated in FIG. 1 for simplicity of the illustration. FIG. 2 is a cross-sectional view taken along line A-A' in FIG. 1 and schematically illustrates a cross-sectional configuration of the TFT array board 1 near the TFT portion. As illustrated in FIG. 2, the TFT array board 1 includes a common electrode Com, a pixel electrode Pix and an insulation film PAS2 and the pixel electrode Pix is overlaid on (opposed to) the common electrode Com having the insulation film PAS2 therebetween. The common electrode Com is formed on an organic insulation film C1.

As illustrated in FIG. 1, a gate line g2 extends in a right-left direction in FIG. 1. A gate electrode (an example of a first electrode) g1 branches from the gate line g2. The gate electrode g1 has a substantially rectangular shape in a plan view of the board. The gate electrode g1 and the gate line g2 are included in the gate metal (a gate conductive film) G. The gate metal G is formed on a transparent substrate B that is a glass board, for example. As illustrated in FIG. 2, a gate insulation film (an example of a first insulation film) GI is formed on the transparent substrate B to cover the gate metal G. The gate insulation film GI is formed on the gate metal G.

As illustrated in FIG. 2, the semiconductor film SF is formed on a portion of the gate insulation film GI corresponding to the gate electrode g1 of the gate metal G. As illustrated in FIG. 1, the semiconductor film SF has an elongated rectangular shape, in a plan view of the board, extending in the right-left direction in FIG. 1 (in which the gate line g2 extends). In each of the drawings, one edge portion of the semiconductor film SF on a right side (on a drain electrode s3 side) projects outwardly from the gate electrode g1. Namely, as illustrated in FIG. 1, the one edge portion of the semiconductor film SF projects outwardly from a peripheral edge (an edge portion) of the gate electrode g1 in a plan view of the board. Such a projecting portion may be referred to as a projecting semiconductor film portion SF1. The projecting semiconductor film portion SF1 is directly covered with a drain electrode s3 included in the conductive film (source metal) S.

Another edge portion of the semiconductor film SF on a left side (on a source electrode s1 side) does not project outwardly from the gate electrode g1 and a left-side edge of the semiconductor film SF is on an inner side from a peripheral edge of the gate electrode g1 in a plan view of the board. In this embodiment, the left-side edge portion of the semiconductor film SF is covered with the source electrode s1 and the source line s2 included in the conductive film (source metal) S.

The semiconductor film SF has a width W extending in an upper-lower direction in FIG. 1 (in which the source line s2 extends). The width W of the semiconductor film SF is smaller than a width of the gate electrode g1, the width extending in the upper-loser direction. The width W of the semiconductor film SF is smaller than a width of the source electrode s1 and a width of the drain electrode s3, the widths extending in the upper-lower direction.

The etching stopper film ES is disposed on the semiconductor film SF and the gate insulation film GI to cover at least a middle portion (a channel CH) of the semiconductor film SF. In FIGS. 1 and 2, a distance L represents a width (in the right-left direction in each drawing) of a portion of the etching stopper film ES covering the middle portion (the channel CH) of the semiconductor film SF. The distance L corresponds to a width of the channel CH that is formed between the source electrode s1 and the drain electrode s3. The distance L also corresponds to a distance between the adjacent holes H (hs, hd) that are formed in the etching stopper film ES.

The hole H (hs) is formed in the etching stopper film ES so that the source electrode s1 is disposed on and directly in contact with the semiconductor film. SF therethrough. The hole H (hd) is formed in the etching stopper film ES so that the drain electrode s3 is disposed on and directly in contact with the semiconductor film SF (mainly the projecting semiconductor film portion SF1) therethrough.

The hole H (hd) on the drain electrode s3 side has a shape or an opening size so that an edge of the portion of the semiconductor film SF projecting outwardly from the gate electrode g1 (the right edge portion in each drawing or the projecting semiconductor film portion SF1) is within the hole in a plan view of the board. More specifically, the hole H (hd) has an opening width in the right-left direction (in which the gate line g2 extends) so that the projecting semiconductor film portion SF1 is located within the opening width. The portion of the semiconductor film SF corresponding to the hole H (hd) is uncovered with the etching stopper film ES and a surface of the portion (including a surface of the projecting semiconductor film portion SF1) is exposed through the hole H (hd).

In this embodiment, the hole H (hs) on the source electrode s1 side has a shape or an opening size so that another edge (the left edge portion in each drawing) of the semiconductor film SF is within the hole in a plan view of the board. The hole (hs) is smaller than the hole H (hd) on the drain s3 side. The portion of the semiconductor film SF corresponding to the hole H (hs) is uncovered with the etching stopper film ES and a surface of the portion is exposed through the hole H (hs).

The holes H (hs, hd) have a width extending in the upper-lower direction (in which the source line s2 extends) so that the respective electrodes (the source electrode s1, the drain electrode s3) are substantially within the width. The width of the holes (hs, hd) in the upper-lower direction is greater than the width W of the semiconductor film SF in the upper-lower direction. In this embodiment, a part of the source line s2 is located within the hole H (hs). A rectangular portion of the drain electrode s3 opposed to the source electrode s1 having the channel CH therebetween is located within the hole H (hd).

The source line s2 is disposed perpendicular to the gate line g2 in a plan view of the board. The source electrode s1 branches from the source line s2. The source electrode s1 is partially disposed on the semiconductor film SF. The portion of the source electrode s1 is disposed on a portion of the semiconductor film SF that is exposed through the hole H (hs).

The drain electrode s3 is disposed to be opposed to the source electrode s1 having a distance therebetween on the semiconductor film SF. The drain electrode s3 is partially disposed on the semiconductor film SF. The portion of the drain electrode s3 is disposed on a portion of the semiconductor film SF exposed through the hole H (hd) so as to be directly in contact therewith.

As illustrated in FIG. 1, the source electrode s1 and the drain electrode s3 have a dimension in the upper-lower direction in FIG. 1 (in which the source line s2 extends) and the dimension is greater than that of the semiconductor film SF. In other words, edges of the semiconductor film SF are located on an inner side with respect to the edges of the source electrode s1 and the drain electrode s3 in the upper-lower direction (in which the source line s2 extends).

As illustrated in FIG. 2, a protection film PAS1 is formed to cover the conductive film S (the source electrode s1, the source line s2, and the drain electrode s3). The organic insulation film OI, the common electrode Com, the protection film PAS2, and the pixel electrode Pix are sequentially disposed to cover the protection film PAS1.

(Reducing Cgd Capacitance)

Figure 3:
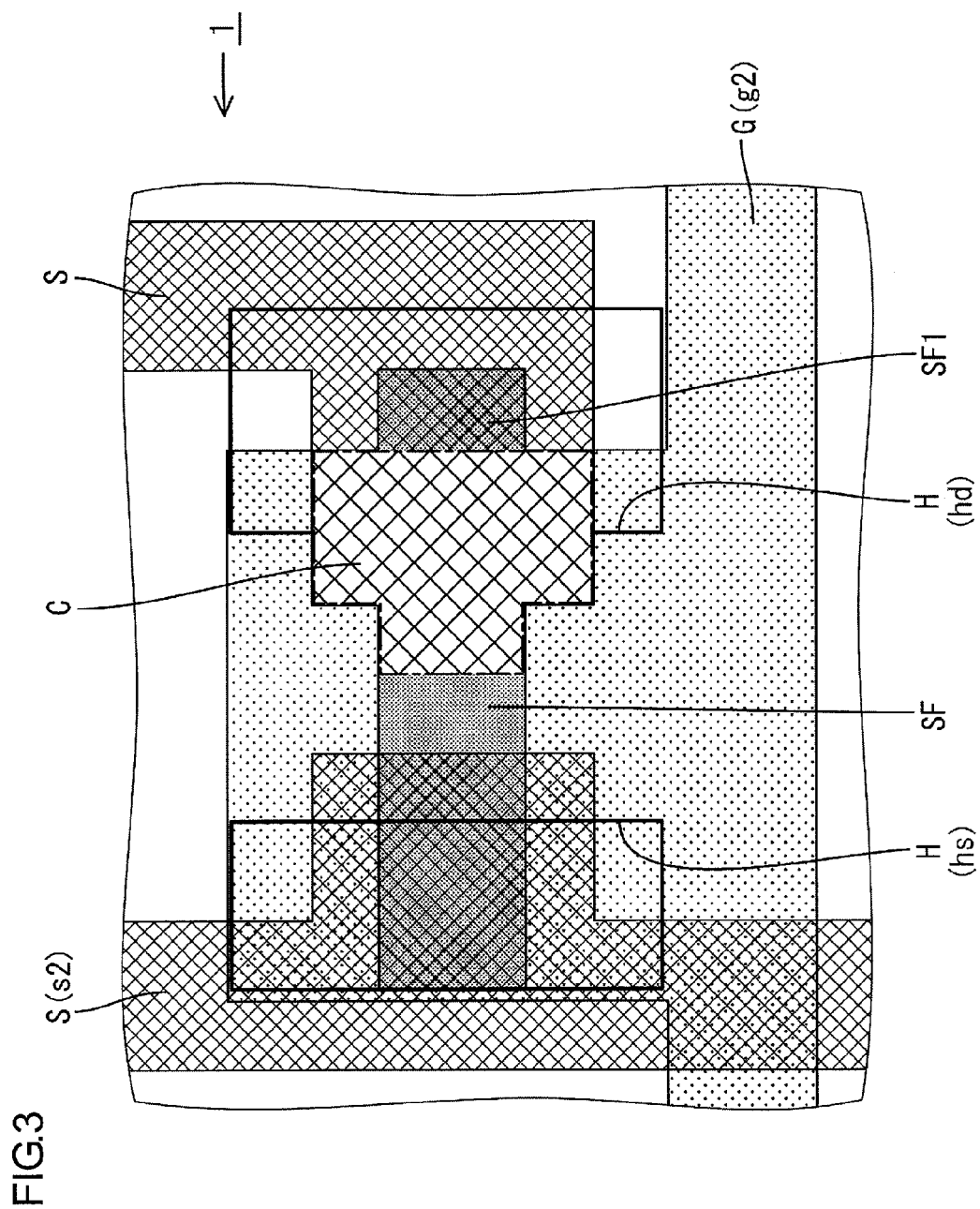
FIG. 3 is a schematic view illustrating an overlap area where a gate metal, a semiconductor film and a source metal are overlapped.

The TFT array board (the semiconductor device) 1 of this embodiment having the above configuration reduces the Cgd capacitance. Reasons of reduction in the Cgd capacitance will be described below. FIG. 3 is a schematic view illustrating an overlap area C of the gate metal G including a portion of the gate metal G overlapping the semiconductor film SF and a portion thereof overlapping the source metal (the conductive film) S. FIG. 3 illustrates a planar configuration of the TFT array board 1 similar to that in FIG. 1. The gate electrode (the first electrode) g1 included in the gate metal G overlaps the semiconductor film SF and the source metal (the conductive film) S via the gate insulation film (the first insulation film) GI in a plan view of the board.

In this embodiment, the gate electrode g1 does not overlap a substantially entire area of the drain electrode unlike the conventional gate electrode. The gate electrode g1 has a shape or a size so that apart of the drain electrode s3 does not overlap the gate electrode g1. In this embodiment, specifically, the gate electrode g1 has a width in the right-left direction (in which the gate line g2 extends), and at least the width is smaller (shortened especially on the drain electrode s3 side) than that of the conventional gate electrode. Thus, in the TFT array board 1 according to this embodiment, the overlap area C of the gate metal G overlapping each of the semiconductor film SF and the source metal (the conductive film) S is smaller than that of the conventional board. Therefore, in this embodiment, the capacitance between the gate electrode g1 and the drain electrode s3 (Cgd capacitance) is reduced.

(Less Occurrence of Deterioration in Performances of Semiconductor Film SF)

In the TFT array board 1 having the above configuration, the semiconductor film SF is less likely to receive light BL from the backlight device (not illustrated) and have deterioration in performances thereof. Reasons of less occurrence of deterioration in performances of the semiconductor film SF will be described below. A liquid crystal display device (not illustrated) where a liquid crystal panel including the TFT array board 1 is mounted includes a backlight device as a light source. The liquid crystal panel mainly includes the TFT array board 1, a counter board (a color filter board) that is opposite the TFT array board 1, and a liquid crystal layer sandwiched between the TFT array board 1 and the counter board. The backlight device exits light BL toward the TFT array board 1. The light BL from the backlight device enters the TFT array board 1 and travels from the transparent substrate B side toward the liquid crystal layer side.

Most part of the semiconductor film SF is above the gate electrode (the first electrode) g1 and overlaps the gate electrode g1 in a plan view of the board. However, as described above, the end portion of the semiconductor film SF (that is the projecting semiconductor film portion SF1) disposed on the drain electrode s3 side projects outwardly from the gate electrode g1. As illustrated in FIG. 2, the light BL directed toward the gate electrode g1 is blocked by the gate electrode g1. Therefore, the light BL that is blocked by the gate electrode g1 does not directly reach the most part of the semiconductor film SF that is disposed above the gate electrode g1 to overlap the gate electrode g1. Accordingly, the most part of the semiconductor film SF overlapping the gate electrode 1 is less likely to receive the light BF and therefore, the reaction caused by the light is less likely to be accelerated.

Apart of rays of light BL emitted from the backlight device is directed toward the projecting portion (the projecting semiconductor film portion SF1) of the semiconductor film SF projecting outwardly from the gate electrode g1. The part of the rays of the light BL passes through the transparent substrate B and the gate insulation film (the first insulation film) GI and reaches the projecting semiconductor film portion SF1. The drain electrode s3 included in the conductive film (the source metal) S is disposed on the projecting semiconductor film portion SF1 to be directly in contact therewith. Specifically, the drain electrode s3 is disposed on a surface of the projecting semiconductor film portion SF1 and also on a surface of a portion of the semiconductor film SF exposed through the hole H (hd). Accordingly, the projecting semiconductor film portion SF1 is electrically connected to the drain electrode s3 and the etching stopper film ES made of insulation material is not disposed between the projecting semiconductor film portion SF1 and the drain electrode s3.

Therefore, even if the light BL from the backlight device reaches the projecting semiconductor film portion SF1 and reaction is caused by the light in the projecting semiconductor film portion SF1, generated charges move from the projecting semiconductor film portion SF1 to the drain electrode s3 that is in contact with the projecting semiconductor film portion SF1. As a result, even if the light BL reaches the projecting semiconductor film portion SF1 of the semiconductor film SF, the charge storage is less likely to occur in the semiconductor film SF and eventually, the performances of the semiconductor film SF are less likely to be deteriorated.

As described above, in the TFT array board 1 according to this embodiment, the Cgd capacitance is reduced and the performances of the semiconductor film SF are less likely to be deteriorated.

(Process of Manufacturing TFT Array Board 1)

Figure 4:
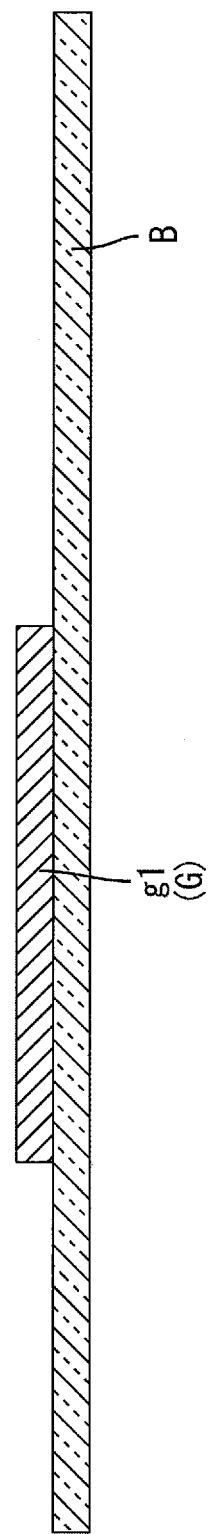
FIG. 4 is a cross-sectional view of a board after the gate metal is formed thereon taken along line A-A' in FIG. 1.

Next, a process of manufacturing the TFT array board 1 according to the first embodiment will be described in detail. FIG. 4 is a schematic cross sectional view of the board after the gate metal G is formed, and the cross sectional view is taken along line A-A' in FIG. 1. As illustrated in FIG. 4, first, the gate metal G (including the gate electrode (first electrode) g1) is formed on the transparent substrate B such as a glass substrate. In the process of forming the gate metal G, for example, a layer of the gate metal G is formed on the transparent substrate B and thereafter, the gate metal G is formed in a predetermined pattern to have a desired shape using photolithography. Specifically, a resist having the predetermined pattern is formed on the layer of the gate metal G with a masking process. Thereafter, the layer of the gate metal G is subjected to etching to form a patterned gate metal G. Then, the resist is removed from the gate metal G.

Figure 5:
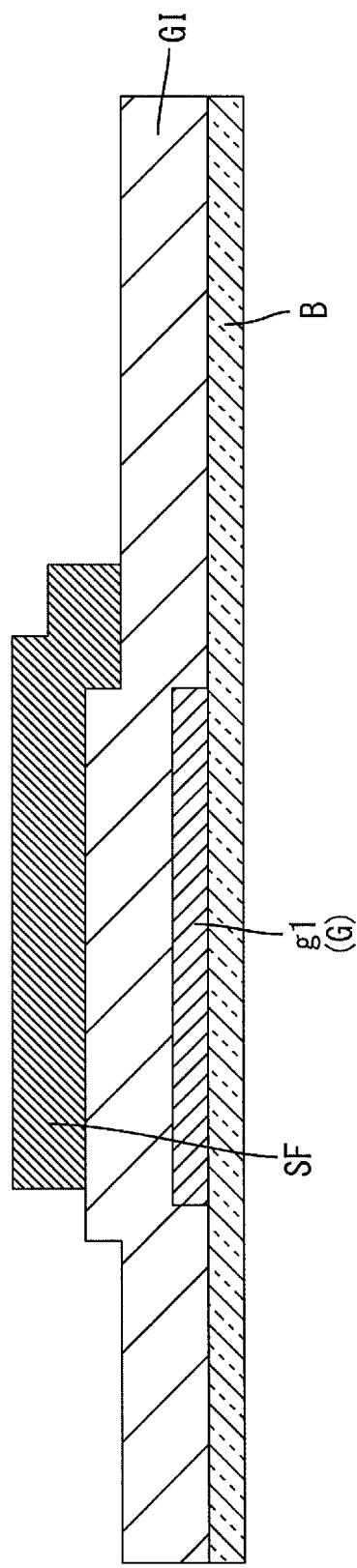
FIG. 5 is a cross-sectional view of a board after a gate insulation film and the semiconductor film are formed thereon taken along line A-A' in FIG. 1.

FIG. 5 is a schematic cross sectional view of the board after the gate insulation film GI and the semiconductor film SF are formed, and the cross sectional view is taken along line A-A' in FIG. 1. After the gate metal G is formed as described above, the gate insulation film (the first insulation film) GI is formed. The gate insulation film GI is a silicon nitride (SiNx) film or a silicon oxide (SiO2) film, for example, and is formed with a plasma enhanced chemical vapor deposition (PECVD) method. The gate insulation film GI may be a single-layered film or a multi-layered film including two or more layers.

Next, as illustrated in FIG. 5, the island-like semiconductor film SF formed of oxide semiconductors containing indium gallium zinc oxide is formed on the gate insulation film GI. The island-like semiconductor film SF is formed as follows, for example. Material of oxide semiconductors is deposited on the gate insulation film GI to form a film (with a film thickness of 10 nm to 300 nm) with sputtering. Then, the film is formed in a predetermined pattern to have a desired shape using photolithography and the island-like semiconductor film SF is formed.

Figure 6:
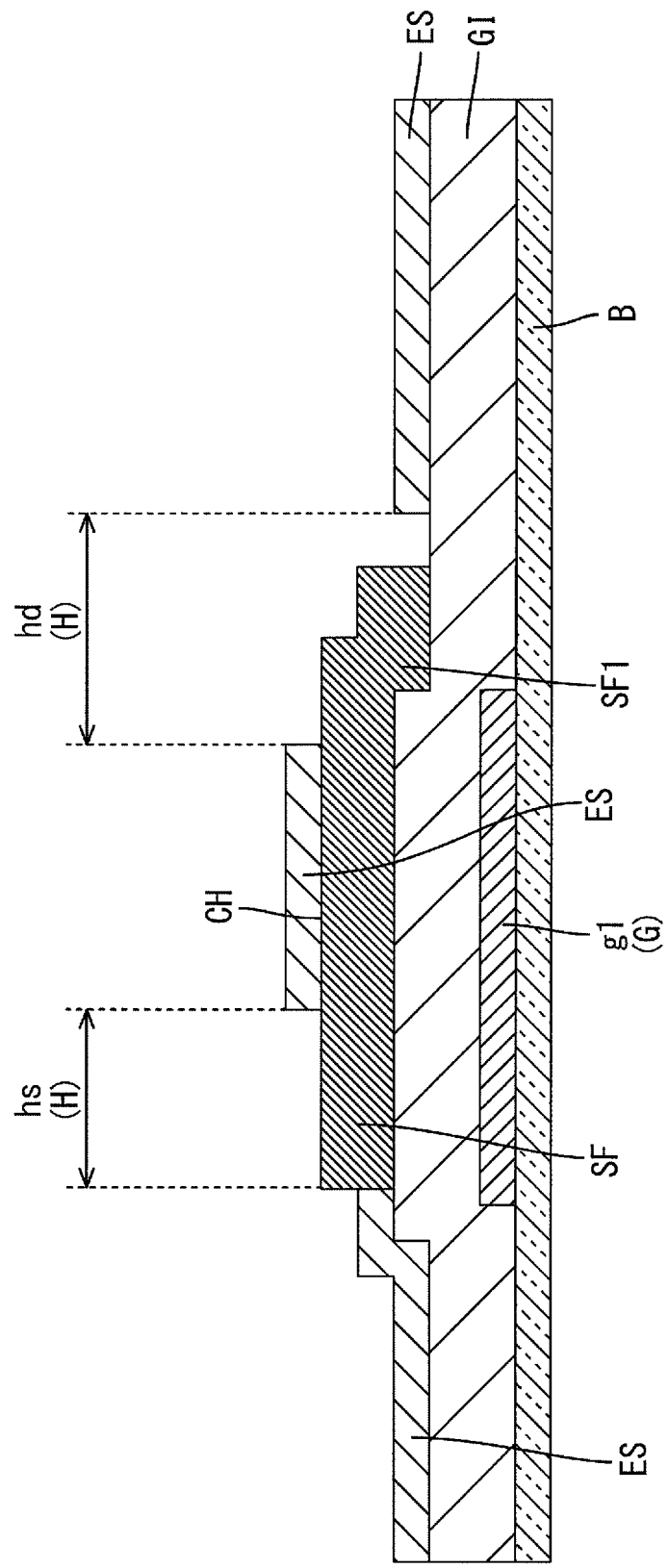
FIG. 6 is a cross-sectional view of a board after an etching stopper film is formed thereon taken along line A-A' in FIG. 1.

FIG. 6 is a schematic cross sectional view of the board after the etching stopper film ES is formed, and the cross sectional view is taken along line A-A' in FIG. 1. The etching stopper film ES is formed as follows. The insulation film having a thickness of 50 nm to 300 nm is formed from insulating material containing silicon (such as a silicon oxide (Sio2) film, a silicon nitride (SiNx) film, a silicon nitride oxide (SiNO) film) with the plasma enhanced chemical vapor deposition (PECVD) method or by sputtering. Then, a resist is formed on the insulation film with masking and the insulation film is subjected to etching and thus the etching stopper film ES is formed. The resist is removed if necessary. The obtained etching stopper film ES has holes H (hs, hd). The etching stopper film ES is formed to cover at least the middle portion (the channel CH) of the island-like photoconductive film SF.

The etching stopper film ES is formed to have the above configuration to maintain reliability of the TFT array board 1 including the semiconductor film SF. The etching stopper film ES is formed not to cover the projecting semiconductor film portion SF1. Therefore, the hole H (hd) has an opening shape and an opening size so that the projecting semiconductor film portion SF1 is within the hole.

The semiconductor film SF has the middle portion (the channel CH) between the two holes H (hs, hd) formed in the etching stopper film ES in a plan view of the board.

Figure 7:
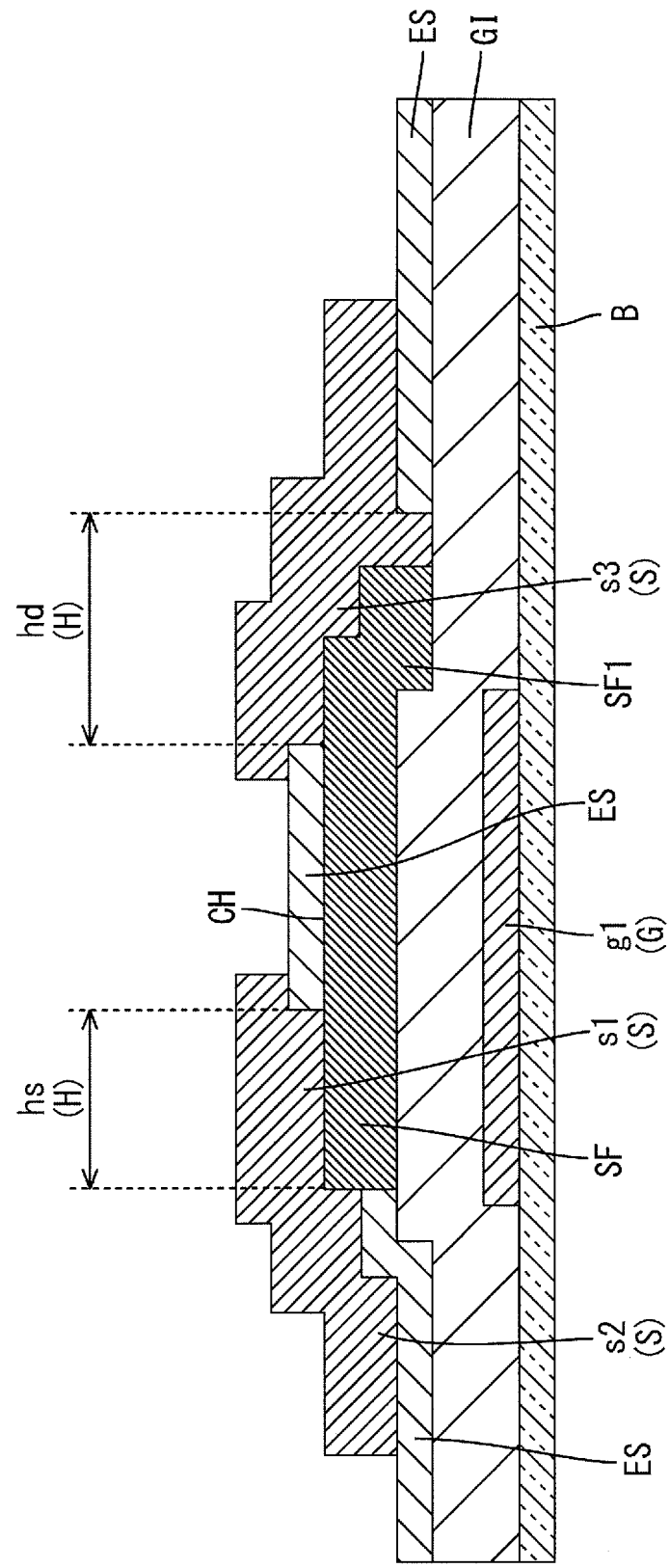
FIG. 7 is a cross-sectional view of a board after a conductive film is formed thereon taken along line A-A' in FIG. 1.

FIG. 7 is a schematic cross sectional view of the board after the conductive film (the source metal) S is formed, and the cross sectional view is taken along line A-A' in FIG. 1. After the etching stopper film ES is formed as described above, the conductive member included in the conductive film (the source metal) S is deposited to cover portions of the semiconductor film SF exposed through the holes H (hs, hd) and form a layer. Then, a resist is formed on the layer (film) of the conductive material (deposited substances) with masking and the conductive material is subjected to etching. The layer (film) of the conductive material is formed in a predetermined pattern with wet etching. As a result, the conductive film (the source metal) S including the source electrode s1, the source line s2 and the drain electrode s3 is formed from the layer of the conductive material. Then, the resist is removed from the board if necessary.

The process of forming the conductive film S is preferably performed with wet etching. Pattering with wet etching reduces a manufacturing cost of the TFT array board 1. Examples of etchants used for wet etching may include hydrogen peroxide etchant and mixture of phosphoric acid, nitric acid, and acetic acid. The hydrogen peroxide etchant is used as etchant for a Cu/Ti multi-layered source metal containing copper (Cu) in an upper layer and titanium (Ti) in a lower layer. The hydrogen peroxide etchant is generally used for copper (Cu). The mixture of phosphoric acid, nitric acid, and acetic acid is used as etchant for a Mo/Al/Mo multi-layered source metal and is generally used for aluminum (A). Accordingly, the multi-layered source metal is collectively subjected to etching.

The conductive film S is formed as described above, and the drain electrode s3 is disposed on the semiconductor film SF to be directly in contact with the portion of the semiconductor film SF exposed through the hole H (hd).

Figure 8:
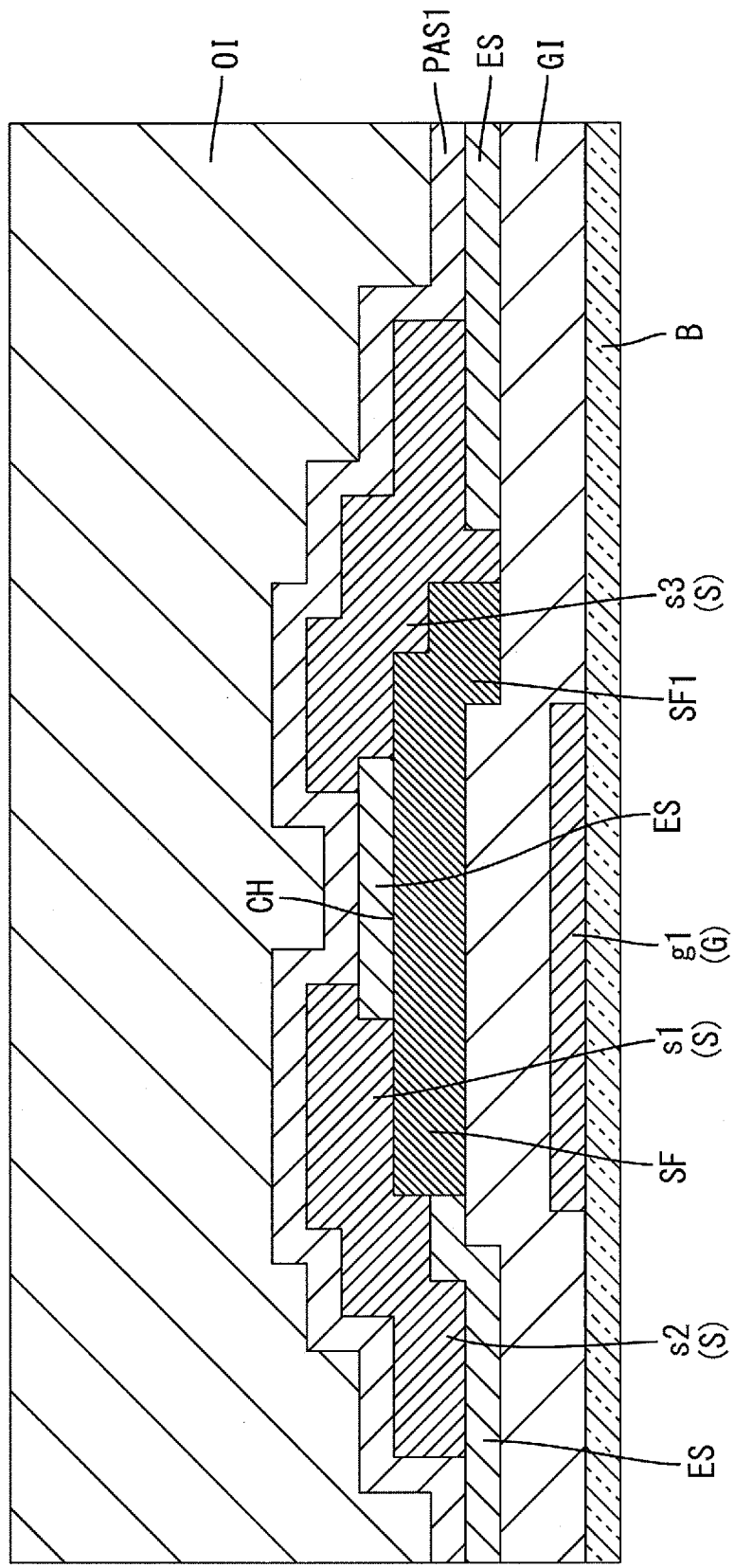
FIG. 8 is a cross-sectional view of a board after a protection film and an organic insulation film are formed thereon taken along line A-A' in FIG. 1.

FIG. 8 is a schematic cross sectional view of the board after the protection film PAS1 and the organic insulation film OI are formed, and the cross sectional view is taken along line A-A' in FIG. 1. After the conductive film S is formed as described above, the protection film PAS1 is formed on the etching stopper film ES to cover the conductive film S. The protection film PAS1 may be a silicon nitride (SiNx) film or a silicon oxide (Sio2) film formed with the plasma enhanced chemical vapor deposition (PECVD) method. Subsequently, the organic film OI is formed on the protection film PAS1. The organic insulation film OI may be made of acrylic resin and formed with spin coating. Formation of the organic insulation film OI makes a surface of the board to be flat as illustrated in FIG. 8.

Figure 9:
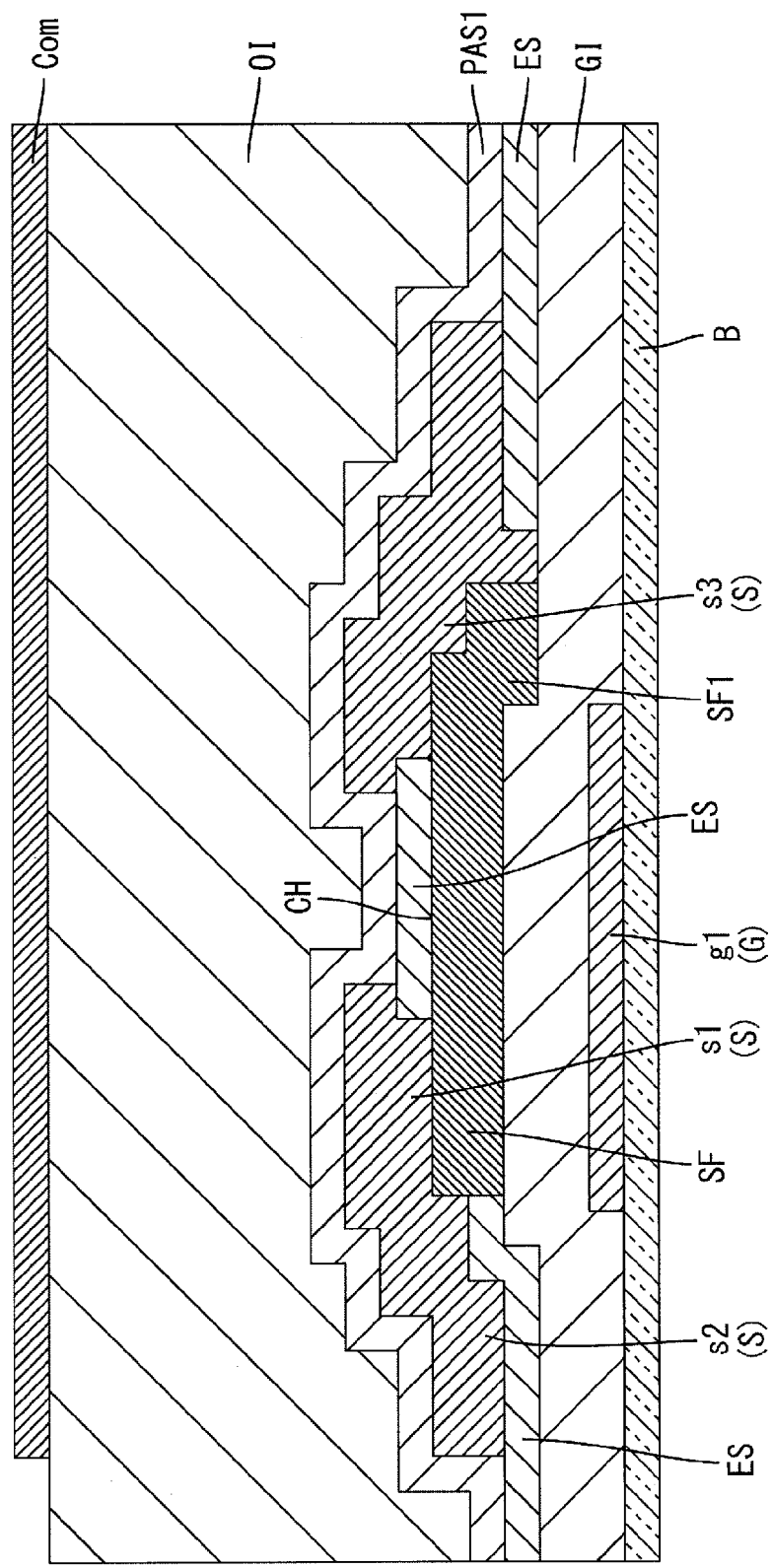
FIG. 9 is a cross-sectional view of a board after a common electrode is formed thereon taken along line A-A' in FIG. 1.

FIG. 9 is a schematic cross sectional view of the board after the common electrode Com is formed, and the cross sectional view is taken along line A-A' in FIG. 1. After the organic insulation film OI is formed as described above, electrode material for the common electrode Com is deposited on an entire surface of the organic insulation film OI with sputtering to form a layer made of the electrode material. Examples of the electrode material include a transparent electrode material such as indium tin oxide (ITO) and indium zinc oxide (IZO). Subsequently, the layered electrode material deposited on the organic insulation film OI is formed in a predetermined pattern to obtain the common electrode Com.

Figure 10:
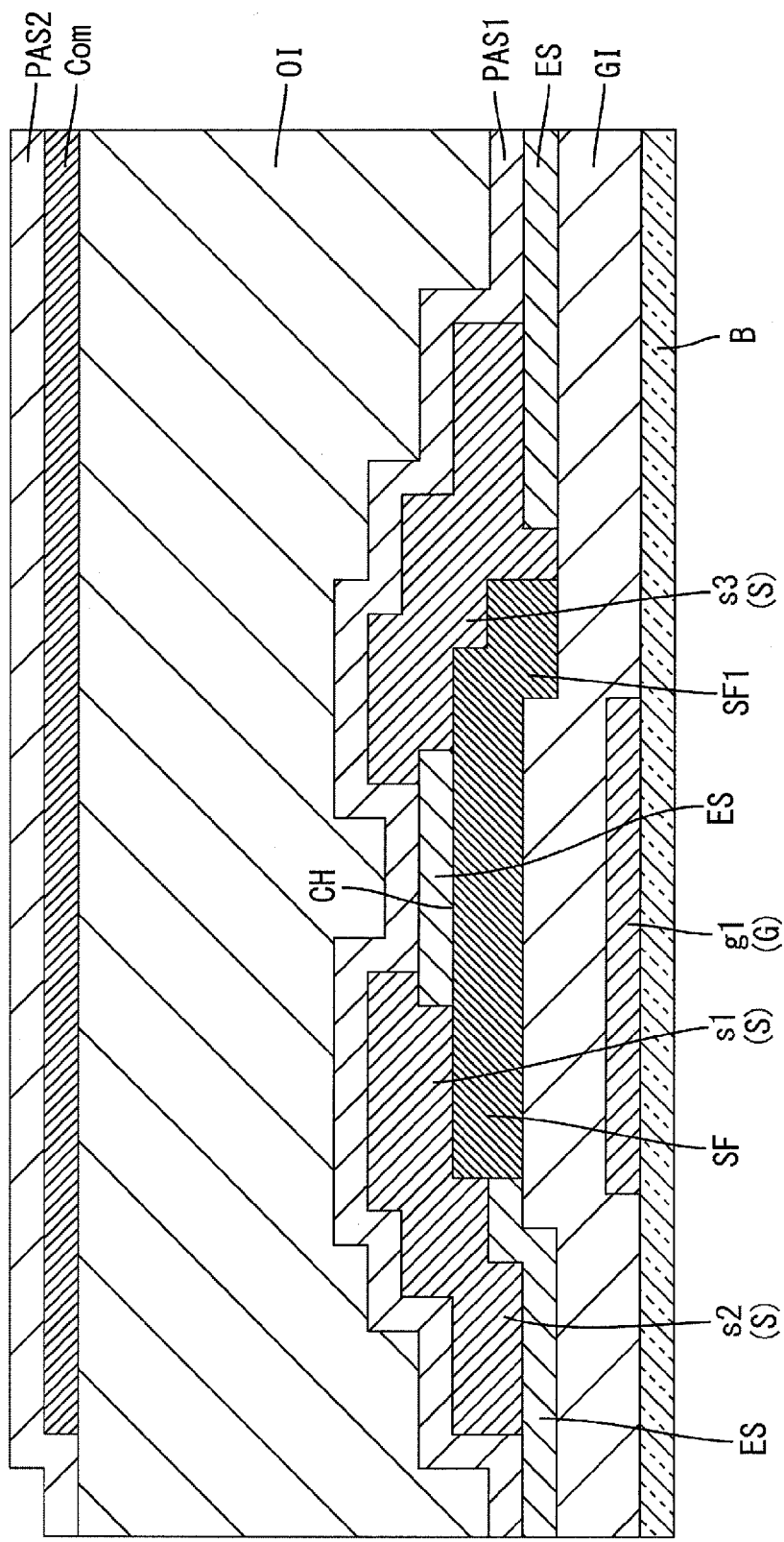
FIG. 10 is a cross-sectional view of a board after a protection film is formed thereon taken along line A-A' in FIG. 1.

FIG. 10 is a schematic cross sectional view of the board after the protection film PAS2 is formed, and the cross sectional view is taken along line A-A' in FIG. 1. After the common electrode Com is formed as described above, the protection film PAS2 is formed on the common electrode Com. The protection film PAS2 may be a silicon nitride (SiNx) film formed with the plasma enhanced chemical vapor deposition (PECVD) method similarly to the above protection film PAS1.

Next, electrode material for the pixel electrode Pix is deposited on the protection film PAS2 by sputtering to form a layer of the electrode material. Examples of the electrode material include a transparent electrode material (transparent conductive film) such as indium tin oxide (ITO) and indium zinc oxide (IZO) similarly to the common electrode Com. Subsequently, the layered electrode material deposited on the protection film PAS2 is formed in a predetermined pattern to obtain the pixel electrode Pix. As a result, the TFT array board 1 having the cross sectional configuration illustrated in FIG. 2 is obtained. The TFT array board 1 is manufactured via the above processes. In the TFT array board 1, the pixel electrode Pix is connected to the drain electrode s3 via contact holes, which are not illustrated. Therefore, holes (contact holes) are formed through the common electrode Com and the organic insulation film OI in the thickness direction thereof to connect the pixel electrode Pix to the drain electrode s3. The TFT array board 1 may further include an alignment film for controlling alignment of liquid crystal molecules contained in the liquid crystal layer, a polarizing plate, and an optical film, if necessary.

The components described in the process of manufacturing the TFT array board according to the first embodiment will be specifically described. The conductive film S is formed of the source metal. In this embodiment, the source metal includes the source line s2 and the components that are formed in the same process of forming the source line s2 (the source electrode s1, the drain electrode s3 and so on). The conductive film S is formed of a metal-layered member such as a Cu/Ti multi-layered member and a Mo/Al/Mo multi-layered member. The conductive film S may include an aluminum layer, an aluminum alloy layer, a copper layer, or a copper alloy layer, as appropriate.

The aluminum layer is substantially formed of only aluminum metal. In manufacturing lines including the aluminum layer, elements may be dispersed from other metal material or an insulation film between layers that may be in contact with the aluminum layer. Therefore, the aluminum layer may contain small amount of impurity element. The aluminum alloy layer necessarily contains aluminum and may contain other metal elements or non-metal element such as silicon. Metal elements such as nickel, iron, and cobalt may be added to the aluminum alloy. Additional elements such as boron, neodymium, lanthanum may be preferably added to the aluminum alloy.

The copper layer is substantially formed of only copper. Elements may be dispersed from other metal material or the protection film PAS1 that may be in contact with the copper layer. Therefore, the copper layer may contain small amount of impurity element. The copper alloy layer necessarily contains aluminum and may contain other metal elements or non-metal element such as carbon or silicon. Metal elements such magnesium and manganese may be added to the copper alloy.

The conductive film S may contain other metal elements, if necessary.

The lines include signal lines for transmitting electric signals, a power line for supplying power, traces forming a circuit, lines for applying an electric field (for example, applying an electric field to the gate of the TFT). In a liquid crystal display device (an example of the display device) including the TFT array board 1 according to this embodiment, the TFT array board 1 of this embodiment may further include auxiliary capacitance lines that generate auxiliary capacitance to maintain voltage that is applied to the liquid crystals.

The semiconductor component is preferably a thin film transistor (TFT). The source line s2 is electrically connected to the pixel electrode Pix that forms a display pixel via the source electrode s1 and the drain electrode s3 included in the TFT.

The transparent substrate B is not limited to any special substrate but may be various substrate. Examples of the transparent substrate B include a single crystal semiconductor substrate, an oxide single crystal substrate, a metal substrate, a glass substrate, a quarz substrate, and a resin substrate. An insulation film may be preferably disposed on the conductive substrate such as the single crystal semiconductor substrate or the metal substrate.

The TFT array board 1 according to the first embodiment is resolved into components to confirm a pattern shape of the liquid crystal panel (liquid crystal cell) with observation by a microscope such as an optical microscope, a scanning transmission electron microscope (STEM), or a scanning electron microscope (SEM).

As described above, the TFT array board (the semiconductor device) 1 of this embodiment includes the transparent substrate (substrate) B, the gate electrode (first electrode) g1 formed on the transparent substrate B, the gate insulation film (first insulation film) GI, the semiconductor film SF, the etching stopper film ES, and the drain electrode (second electrode) s3. The gate insulation film (the first insulation film) GI is formed on the gate electrode (the first electrode) g1 and the transparent substrate B to cover the gate electrode (the first electrode) g1. The semiconductor film SF is formed of an oxide semiconductor film and includes the channel CH. The semiconductor film SF is formed on the gate insulation film GI and overlaps the gate electrode g1 so that the edge portion (projecting semiconductor film portion) SF1 projects outwardly from the gate electrode g1 in a plan view. The etching stopper film. ES is formed of an insulation film that is formed on the gate insulation film (the first insulation film) GI and the semiconductor film SF to cover the channel CH. The etching stopper film ES includes a hole H (hd), and the edge portion (the projecting semiconductor film portion) SF1 of the semiconductor film SF is within the hole H (hd) in a plan view and the surface of the semiconductor film SF near the channel is exposed through the hole H (hd). The drain electrode (the second electrode) s3 is deposited on the semiconductor film SF to cover the surface of the semiconductor film SF exposed through the hole H (hd).

Light enters the TFT array board (the semiconductor device) 1 having such a configuration from the transparent substrate B side and a part of rays of the light passes through the gate insulation film. GI and is directed toward the projecting semiconductor film portion SF1 projecting outwardly from the gate electrode g1. The projecting semiconductor film portion SF1 that does not overlap the gate electrode g1 directly receives light. The drain electrode s3 is deposited on the semiconductor film SF to cover the surface of a portion of the semiconductor film SF exposed through the hole H (hd) and therefore, the projecting semiconductor film portion SF1 and the drain electrode s3 are in contact with each other to be electrically connected to each other. Accordingly, if the projecting semiconductor film portion SF1 receives light and a reaction is caused by the light, generated charges move from the projecting semiconductor film portion SF1 to the drain electrode s3 that is in contact with the projecting semiconductor film portion SF1. As a result, even if the projecting semiconductor film portion SF1 that is not covered with the gate electrode g1 in a plan view receives light, the charges are less likely to be stored in the semiconductor film SF and eventually, the performances of the semiconductor film SF are less likely to be deteriorated.

In the TFT array board (the semiconductor device) 1 of this embodiment, a portion of the semiconductor film SF other than the projecting semiconductor film portion SF1 is within an area of the gate electrode g1 in a plan view. If light directed toward the transparent substrate B side of the TFT array board (the semiconductor device) 1 is directed toward the portion of the semiconductor film SF other than the projecting semiconductor film portion SF1, the light is blocked by the gate electrode g1 that overlaps the portion of the semiconductor film SF. Because the semiconductor film SF is arranged so that the portion thereof other than the projecting semiconductor film portion SF1 is within an area of the gate electrode g1 in a plan view, light is less likely to reach the portion (other than the projecting semiconductor portion SF1) and performances of the semiconductor film SF are less likely to be deteriorated.

In the TFT array board (the semiconductor device) 1 according to this embodiment, the semiconductor film SF has an elongated shape extending in a direction in which the projecting semiconductor film portion SF1 projects (in which the gate line g2 extends) in a plan view. A portion of the semiconductor film SF that the drain electrode s3 overlaps is within an area of the drain electrode s3. In this embodiment, the semiconductor film SF has a substantially rectangular shape extending in the right-left direction (in which the gate line g2 extends) in a plan view in each drawing. An edge portion of the semiconductor film SF opposite to the projecting semiconductor film portion SF1 is within an area of the source electrode s1 and an area of the source line s2 in a plan view of the board.

<Second Embodiment>

Figure 11:
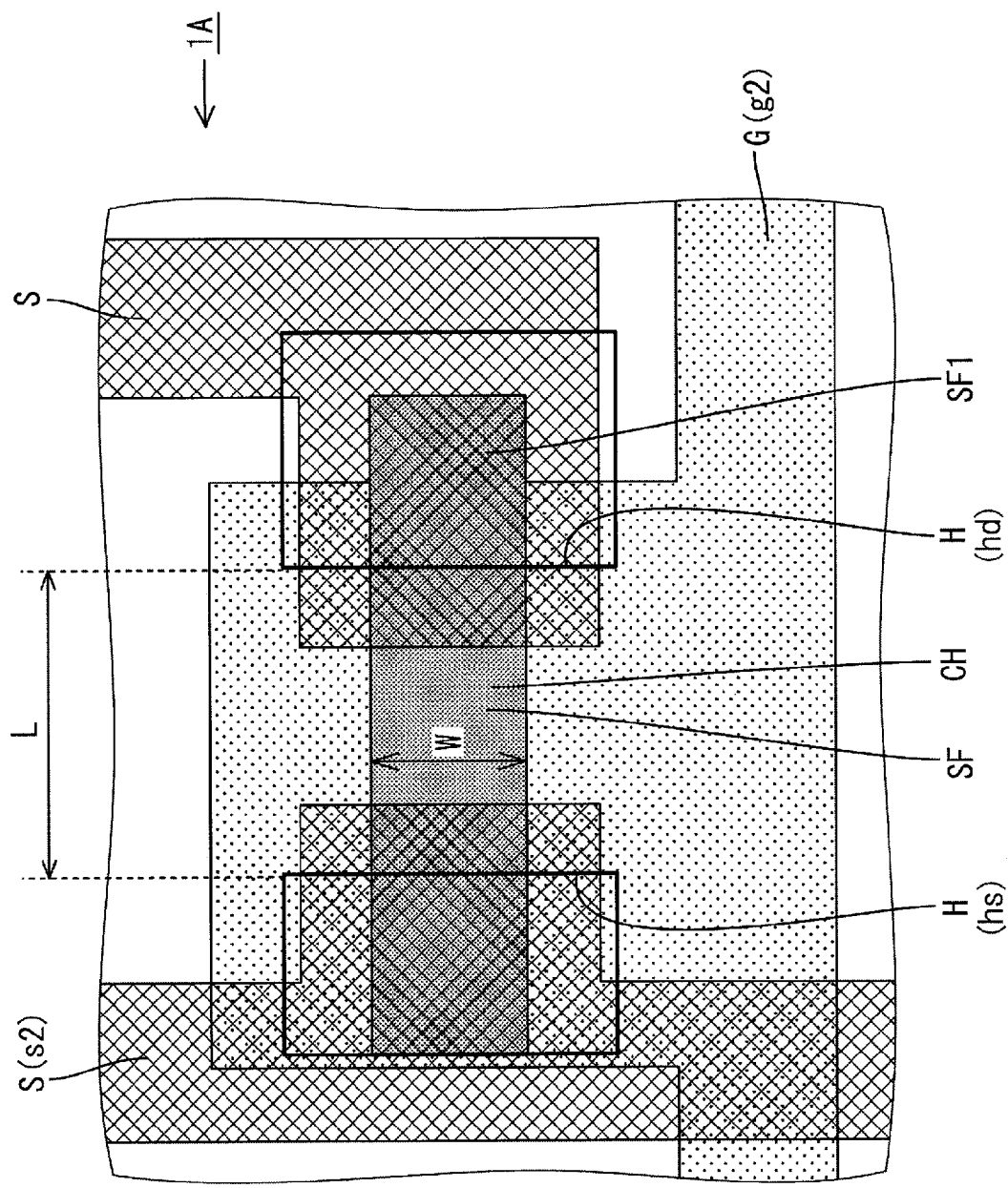
FIG. 11 is a schematic plan view illustrating a configuration of a TFT portion of a TFT array board according to a second embodiment.

Next, a second embodiment of the present invention will be described with reference to FIG. 11. FIG. 11 is a schematic plan view illustrating a configuration of a TFT portion of a TFT array board 1A according to the second embodiment. In the TFT array board 1A of this embodiment, an opening size of a hole H (hs, hd) formed in the etching stopper film ES is smaller than that in the first embodiment. Similarly to the first embodiment, the hole H (hs, hd) of this embodiment has a vertically-long rectangular opening in a plan view of the board. In this embodiment, the opening of the hole H (hs, hd) has a longitudinal length in the upper-lower direction in FIG. 11 (in which the source line s2 extends) and the longitudinal length is smaller than that of the first embodiment. Specifically, the longitudinal length of the opening of the hole H (hs, hd) in the upper-lower direction is slightly greater than the lengths (widths) of the source electrode s1 and the drain electrode s3 included in the conductive film S extending in the upper-lower direction. In this embodiment, the opening of the hole H (hs, hd) has a length in the right-left direction in FIG. 11 (in which the gate line g2 extends) substantially same as that in the first embodiment. Namely, the projecting semiconductor film portion SF1 of the semiconductor film SF is within an opening area of the hole H (hd). In this embodiment, in forming the conductive film S, the drain electrode s3 is disposed on the semiconductor film SF (mainly the projecting semiconductor film portion SF1) so as to be directly in contact therewith without intervening the etching stopper film ES made of insulation material between the drain electrode s3 and the conductive film SF (mainly the projecting semiconductor film portion SF1). In this embodiment, the opening shape of the hole H (hd) may be altered if necessary, as long as the drain electrode s3 is disposed on the semiconductor film. SF (mainly the projecting semiconductor film portion SF1) so as to be directly in contact therewith without intervening the etching stopper film ES between the drain electrode s3 and the conductive film SF (mainly the projecting semiconductor film portion SF1). In the TFT array board 1A of this embodiment, similarly to the first embodiment, the Cgd capacitance is decreased and the performances of the semiconductor film SF are less likely to be deteriorated.

<Third Embodiment>

Figure 12:
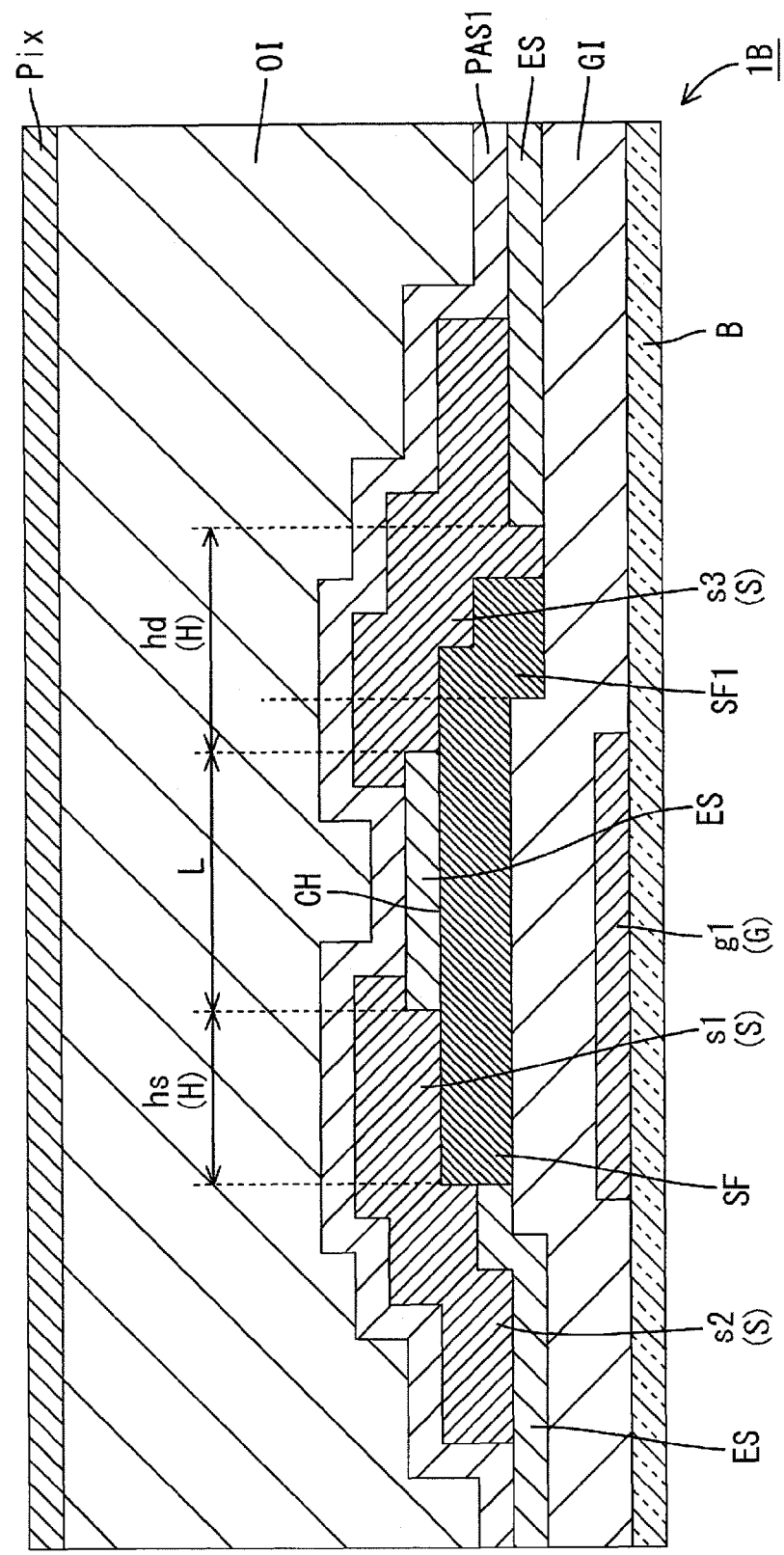
FIG. 12 is a cross-sectional view of a portion of a TFT array board near a TFT portion according to a third embodiment.

Next, a third embodiment of the present invention will be described with reference to FIG. 12. FIG. 12 is a schematic cross sectional view of a portion of a TFT array board 1B near a TFT portion according to the third embodiment. The TFT array board 1B of this embodiment is effectively used in a liquid crystal display device (not illustrated) of a vertical alignment (VA) mode. Most of the configurations of the TFT array board 1B of this embodiment are similar to those of the first embodiment. Therefore, the process of manufacturing the TFT array board 1B of this embodiment is basically same as that in the first embodiment from the first step to the step of forming the organic insulation film OI.

Hereinafter, the manufacturing process after the formation of the organic insulation film. OI will be described and the configuration of the TFT array board 1B of this embodiment will be described. The configurations (such as materials) other than the description of each component are same as those in the above.

As illustrated in FIG. 12, in this embodiment, the pixel electrode Pix is formed on an entire surface area of the organic insulation film OI after the formation of the organic insulation film OI. The pixel electrode Pix is made of transparent electrode material (transparent conductive film) such as indium tin oxide (ITO) and indium zinc oxide (IZO). Thereafter, an alignment film formed of a polyimide resin thin film is formed on the pixel electrode Pix and accordingly, the TFT array board 1B used in the VA mode liquid crystal display device is obtained.

In this embodiment, the hole H (hs, hd) has an opening length elongated in right-left direction (in which the gate line g2 extends) and the opening length is similar to that in the first embodiment. The drain electrode s3 side edge portion of the semiconductor film SF (the projecting semiconductor film portion SF1) is within the hole H (hd) of this embodiment. Therefore, in this embodiment, in forming the conductive film S, the drain electrode s3 is disposed on the semiconductor film SF (mainly the projecting semiconductor film portion SF1) so as to be directly in contact therewith without intervening the etching stopper film ES made of insulation material between the drain electrode s3 and the conductive film SF (mainly the projecting semiconductor film portion SF1). In the TFT array board 1B of this embodiment, similarly to the first embodiment, the Cgd capacitance is decreased and the performances of the semiconductor film SF are less likely to be deteriorated.

<Other Embodiments>

The present invention is not limited to the embodiments described above and illustrated by the drawings. For examples, the following embodiments will be included in the technical scope of the present invention.

(1) In the above embodiments, the opening shape of the hole H of the etching stopper film. ES is rectangular in a plan view of the board. However, the opening shape is not limited thereto as long as the hole H is a through hole.

(2) In the above embodiments, the semiconductor film contains indium gallium zinc oxide as the oxide semiconductors. However, the present invention is not limited thereto. In another embodiment, for example, the semiconductor film may include an oxide that contains at least one selected from a group of indium (In), gallium (Ga), aluminum (Al), copper (Cu), and zinc (Zn).

(3) In the above embodiments, the semiconductor components (the TFT portion) are used as a display portion of the TFT array board. However, the present invention is not limited thereto. In another embodiment, for example, the semiconductor components (the TFT portion) having the above configuration may be used as a monolithic gate driver arranged on the TFT array board.

(4) The array board that is used in the liquid crystal panel is described as the semiconductor device as the embodiments. However, in another embodiment, the semiconductor device may be used in other devices such as an organic EL device, an inorganic EL device, or an electrophoresis device, for example.

Explanation of Symbols 1, 1A, 1B: TFT array board (semiconductor device), B: transparent substrate (substrate), BL: light, C: overlap area, CH: channel, Com: common electrode, ES: etching stopper film, G: gate metal, g1: gate electrode (first electrode), g2: gate line, GI: gate insulation film (first insulation film), H: hole, hs: source electrode side hole, hd: drain electrode side hole, SF: semiconductor film, SF1: projecting semiconductor film portion, L: width of channel (distance between holes), PAS1: protection film, PAS2: protection film, Pix: pixel electrode, S: conductive film (source metal), s1: source electrode, s2: source line, s3: drain electrode (second electrode), W: width of semiconductor film

The invention claimed is:

1. A semiconductor device comprising:
   a substrate;
   a first electrode on the substrate;
   a first insulation film on the first electrode and the substrate so as to cover the first electrode;
   a semiconductor film made of an oxide semiconductor and including a channel and a first edge portion, the semiconductor film being located on the first insulation film and overlapping the first electrode so that the first edge portion projects outwardly from the first electrode;
   an etching stopper film including an insulation film on the semiconductor film and the first insulation film, the etching stopper film covering the channel, the etching stopper film including a hole exposing a surface of a portion of the semiconductor film adjacent to the channel and the first edge portion; and
   a second electrode disposed on the semiconductor film to cover the surface of the portion of the semiconductor film exposed through the hole and in contact with and between both a terminating end of the first edge portion and an edge of the etch stopper film that defines a periphery of the hole opposite the terminating end of the first edge portion, wherein the first edge portion is in contact with and electrically connected to the second electrode and not in contact with the etching stopper film,
an entire surface of the portion of the semiconductor film exposed through the hole is covered by the second electrode, and
the first electrode is a gate electrode, and the second electrode is a metal drain electrode.

2. The semiconductor device according to claim 1, wherein
   the semiconductor film has a shape so that a portion thereof other than the edge portion is within an area of the first electrode in a plan view thereof.

3. The semiconductor device according to claim 1, wherein the semiconductor film has an elongated shape, in a plan view thereof, extending in a direction in which the edge portion projects, and the portion of the semiconductor film on which the second electrode is disposed is within an area of the second electrode.

4. The semiconductor device according to claim 1, wherein the first electrode is branched from a gate line.

5. The semiconductor device according to claim 1, further comprising a source electrode on the semiconductor film so as to be opposite the second electrode with the channel located therebetween.

6. The semiconductor device according to claim 5, wherein the second electrode includes a same conductive material as the source electrode.

7. The semiconductor device according to claim 1, wherein the semiconductor film contains indium gallium zinc oxide.

8. A display device comprising:
   the semiconductor device according to claim 1;
   a counter substrate opposite the semiconductor device; and
   a liquid crystal layer between the semiconductor device and the counter substrate.

9. The display device according to claim 8, further comprising a backlight device that illuminates the semiconductor device.

10. The display device according to claim 1, wherein the semiconductor film further includes a second edge portion at an edge of the channel on an opposite side from the first edge portion, the second edge portion overlaps the first electrode and is in contact with the etching stopper film.

11. The display device according to claim 1, wherein the second electrode includes a conductive film.

12. The display device according to claim 1, wherein the edge of the etch stopper film that defines the periphery of the hole opposite the terminating end of the first edge portion is on the first insulation film.

13. The display device according to claim 1, wherein the second electrode is a multi-layer metal member.

14. The display device according to claim 13, wherein the multi-layered metal member is one of a copper/titanium (Cu/Ti) multi-layered metal member and a molybdenum/aluminum/molybdenum (Mo/Al/Mo) multi-layered metal member or includes one of an aluminum (Al) layer, an aluminum alloy layer, a copper (Cu) layer, and a copper alloy layer.

* * * * *